United States Patent [19]

Glascock, II et al.

[11] Patent Number: 4,574,299

[45] Date of Patent: Mar. 4, 1986

[54] THYRISTOR PACKAGING SYSTEM

[75] Inventors: Homer H. Glascock, II; Constantine A. Neugebauer; Harold F. Webster, all of Schenectady, N.Y.

[73] Assignee: General Electric Company, Schenectady, N.Y.

[21] Appl. No.: 540,739

[22] Filed: Oct. 11, 1983

Related U.S. Application Data

[63] Continuation of Ser. No. 239,719, Mar. 2, 1981, abandoned.

[51] Int. Cl.[4] .................... H01H 23/36; H01H 23/14
[52] U.S. Cl. ........................................ 357/81; 357/65; 357/68; 357/75; 357/76; 357/80
[58] Field of Search ................. 357/65, 71, 75, 76, 357/80, 81, 68

[56] References Cited

U.S. PATENT DOCUMENTS

| | | | |
|---|---|---|---|
| 3,128,419 | 4/1964 | Waldkotter et al. | 357/81 |
| 3,295,089 | 12/1966 | Moore | 357/81 |
| 3,486,083 | 12/1969 | Takada | 357/76 |
| 3,597,658 | 8/1971 | Rivera | 357/65 |
| 4,047,197 | 9/1977 | Schierz | 357/81 |
| 4,106,052 | 8/1978 | Schierz | 357/75 |
| 4,204,628 | 5/1980 | Houston et al. | 228/106 |
| 4,218,695 | 8/1980 | Egerbacher et al. | 357/75 |
| 4,252,263 | 2/1981 | Houston | 228/193 |
| 4,385,310 | 5/1983 | Houston | 357/65 |
| 4,392,153 | 7/1983 | Glascock et al. | 357/65 |

OTHER PUBLICATIONS

Burgess et al, "The Direct Bonding of Metals to Ceramics by The Gas-Metal Eutectic Method" J. Electrochemical Society 122, 688 (1975).
Butler and Glascock, II, "Dual SCR Power Module" Proceedings of IEEE 1980 National Aerospace & Electronics Conf. NAECON, Dayton, Ohio pp. 598–605, vol. II.

Primary Examiner—William D. Larkins
Assistant Examiner—John LaMont
Attorney, Agent, or Firm—John R. Rafter; James C. Davis, Jr.; Marvin Snyder

[57] ABSTRACT

A thyristor packaging system utilizes structured metal, strain buffers to provide paths of high electrical and thermal conductivity from the anode and cathode of a thyristor to power conductors connected to the anode and the cathode, such strain buffers each comprising a bundle of substantially parallel, closely packed strands of metal wire.

19 Claims, 4 Drawing Figures

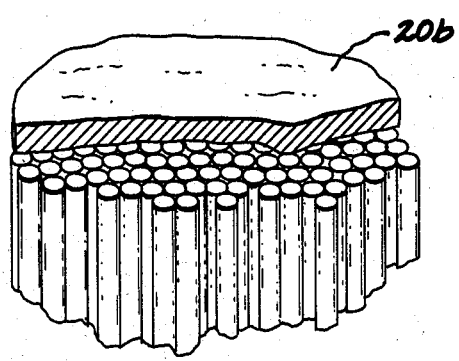
FIG. 2
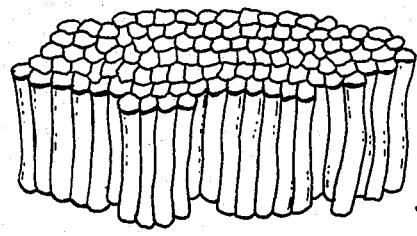
FIG. 3A
FIG. 3B
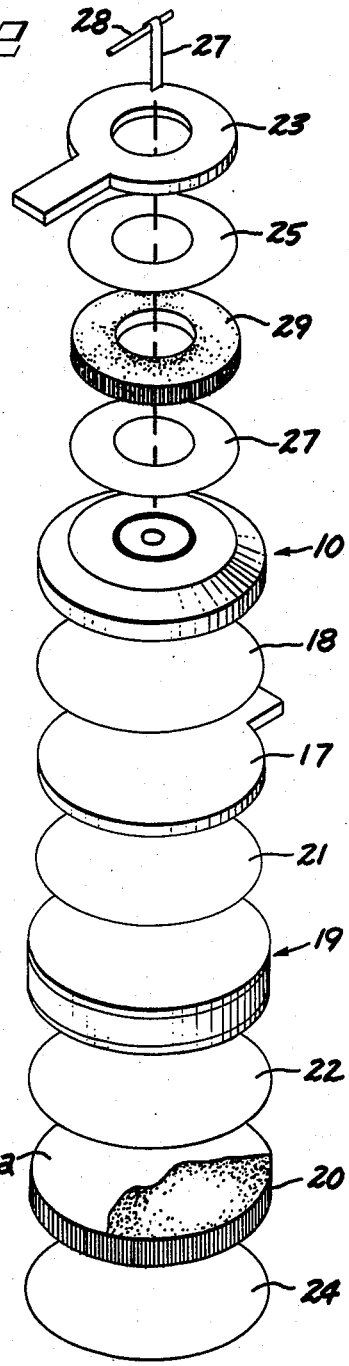

THYRISTOR PACKAGING SYSTEM

This application is a continuation, of application Ser. No. 239,719, filed 3/21/81, abandoned.

BACKGROUND OF THE INVENTION

The present invention relates to a packaging system for a thyristor, and more particularly to such a system providing electrical and thermal connections to a thyristor.

Thyristors are semiconductor devices used for switching power level currents. A thyristor typically has a flat, pellet shape and comprises silicon bonded to a backing plate typically formed of tungsten or molybdenum. Such a thyristor has a cathode on the exterior, flat surface of the silicon and the backing plate serves as an anode. In operation, thyristors become heated to an extent to which is dependent upon the amount of current they carry. The maximum current which a particular thyristor can carry is limited by the maximum temperature which the thyristor can withstand. In order to facilitate removal of heat from a thyristor as well as to provide good electrical contact thereto, the anode and cathode of the thyristor typically comprise substantial surface area. The higher the current carrying rating of the thyristor is, the larger these surface areas are required to be. For a pellet-shaped thyristor above about 12 mm in diameter, the attachment of power conductors to the anode and the cathode thereof is problematic. Suitable power conductors having desirable, high thermal conductivity (for heat removal) such as solid copper have a much higher thermal expansion rate than does silicon. The solder bonding of solid copper to the silicon of such a thyristor, which is feasible for smaller diameter thyristors, is accordingly subject to significant stresses between the solid copper and the silicon. These stresses can result in either the failure of a solder bond or shearing of the silicon.

A known means for attaching power conductors to the anode backing plate and cathode of a thyristor comprises a solid molybdenum strain buffer abutting the cathode of the thyristor, but not bonded thereto, and nickel-coated copper abutting the anode backing plate of the thyristor, but likewise not bonded thereto. Because the interfaces between the foregoing parts are not bonded, they are referred to as "dry interfaces." (This is so whether or not the interfaces are provided with a thermal grease.) The known means further includes bulky structure (that is, large and heavy structure) for pressing the foregoing parts together with a large force. Such force is necessary to provide acceptable electrical and thermal conductivities across the dry interfaces while accommodating the different rates of thermal expansion between the silicon and the power conductor attached to the cathode (which is located on the silicon). Although such electrical and thermal conductivities are usually "acceptable", they typically underutilize the current carrying capacity of the thyristor. It would be desirable to provide a packaging system for a thyristor which does not require a bulky structure for holding the power conductors to the anode and cathode thereof. It would also be desirable to provide a packaging system for a thyristor which utilizes bonds for connection of power conductors to both the anode and cathode of the thyristor rather than dry interfaces.

OBJECTS OF THE INVENTION

Accordingly, it is an object of the present invention to provide a thyristor packaging system not requiring bulky structure for pressing together power conductors to the anode and cathode thereof, as required when dry interfaces are utilized.

A further object of this invention is to provide a thyristor packaging system providing paths of high electrical and thermal conductivity from the anode and cathode of a thyristor to power conductors connected to the anode and the cathode.

Further objects and advantages of the present invention will become apparent from a reading of the remainder of this specification in conjunction with the drawing figures.

SUMMARY OF THE INVENTION

In carrying out this invention, there is provided a thyristor packaging system according to the following. Starting from a metallic support through which heat is withdrawn from a thyristor, a bond is provided from the upper surface thereof to the lower surface of a structured metal, strain buffer. This strain buffer is comprised of a bundle of substantially parallel, closely packed strands of metal wire with upper and lower surfaces of the strain buffer respectively formed from upper, adjacent ends of the strands of metal wire and from lower, adjacent ends of the strands of metal wire. The strain buffer upper surface is connected to a lower surface of a first conductive strap through a low thermal impedance means. An upper surface of the first conductive strap has a bond with a lower electrode of a thyristor. An upper electrode of the thyristor has a bond with a lower surface of a second conductive strap. In a refined version of the invention, the bond between the thyristor upper electrode and the second conductive strap lower surface is characterized as comprising a second structured metal, strain buffer having the same construction as the first, structured metal, strain buffer.

BRIEF DESCRIPTION OF THE DRAWING FIGURES

In the drawing in which various dimensions of the parts shown are exaggerated to facilitate understanding of the invention;

FIG. 2 is an exploded view of various parts associated with one of the thyristors of FIG. 1; and FIGS. 3A and 3B are fragmentary views of alternative means of fabricating a part used in the present invention.

DETAILED DESCRIPTION

Figure 1:
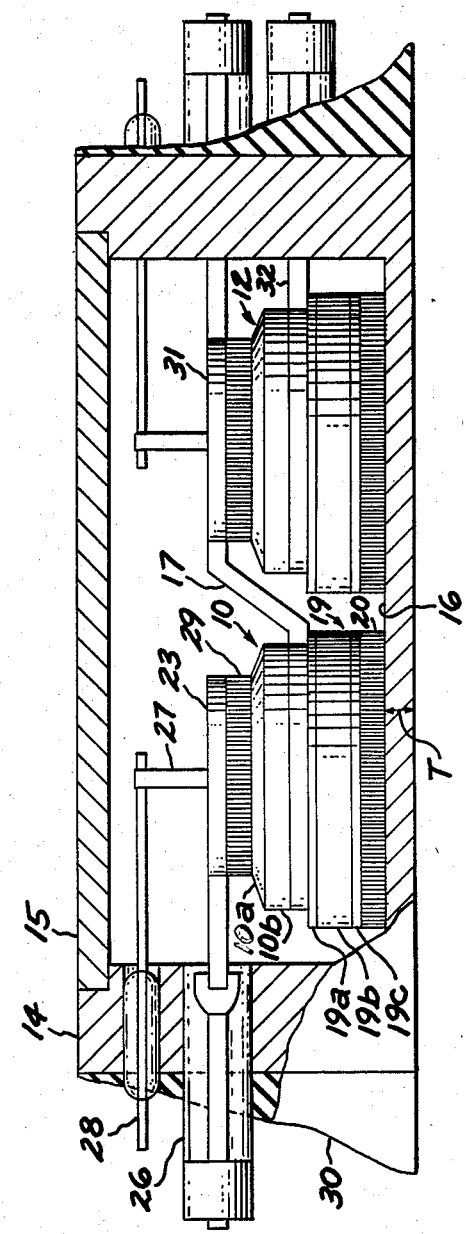
FIG. 1 is a side plan view of a housing partly broken away to show parts of a packaging system for packaging a pair of thyristors in accordance with the present invention.

There is shown in FIG. 1 a thyristor packaging system for thyristors 10 and 12, which may suitably comprise General Electric ® C158S pellet-shaped thyristors with diameters of 18 mm. These thyristors are contained within a low weight, aluminum housing 14 having an aluminum cover 15. The lower portion of housing 14 as shown has a thickness T that is limited to about 50 mils so as to achieve low weight and high thermal conductivity. The housing 14 is shown partially broken away to facilitate viewing of the other parts of the inventive thyristor packaging system. The thyristor 10 comprises an upper, frustro-conical, semiconductor portion 10a, typically formed of silicon, and a lower, cylindrical anode portion 10b, typically formed of molybdenum or tungsten. The anode portion 10b is bonded to the semiconductor portion 10a and serves as a structural backing plate therefor. The anode portion 10b also serves as an anode for the thyristor 10. The upper, exterior surface of the semiconductor portion 10a has the cathode of the thyristor 10 thereon. This anode has a bond with an anode strap 17 suitably of solid copper, this bond being implemented, for example, by a layer of solder 18 visible in the exploded view of FIG. 2. (A bond between the thyristor anode and the anode strap 17 would not be feasible where a thyristor 10 has a sufficiently large diameter, e.g., 2 inches. This would be due to incompatible thermal expansion rates between the anode portion 10b, typically of tungsten or molybdenum and the anode strap 17, typically of solid copper. In such a case, a bond including a structured metal, strain buffer such as discussed below between the anode portion 10b and the anode strap 17 would be suitable.) The anode strap 17 is thermally connected to the lower, interior surface 16 of the housing 15 through an insulating medium 19 and a structured metal, strain buffer 20. Respective bonds are provided between the parts 17, 19, 20 and 16, these bonds suitably being implemented by solder layers 21, 22 and 24, shown in FIG. 2.

The insulating medium 19 serves to electrically isolate the housing 15 from the thyristor 10, whereby additional electrical isolation of the housing 15 is not required. The insulating medium 19 advantageously possesses high thermal conductivity and thus suitably comprises a layer of beryllium oxide or alumina ceramic 19b with upper and lower layers of metal foil 19a and 19c suitably formed of copper and direct bonded to the ceramic 19b. The technique of direct bonding is described in J. F. Burgess, C. A. Neugebauer, and G. Flanagan, "The Direct Bonding of Metals to Ceramics by the Glass-Metal Eutectic Method", J. Electrochem. Soc. 122,688 (1975), incorporated herein by reference. The layers of metal foil 19a and 19c provide paths of high thermal conductivity to the ceramic 19b and can be readily soldered to. The insulating medium 19 may be deleted altogether if the feature of electrical isolation between the housing 15 and the thyristor 10 is not required. (As will be manifest to those skilled in the art, the electrical interconnections to the thyristors 10 and 12 and the relative orientations thereof may need to be altered in an obvious way if the insulating medium is deleted.)

The structured metal, strain buffer 20 comprises a bundle of substantially parallel, closely packed strands of metal wire. The strain buffer 20 is typically formed by filling a pipe with a plurality of parallel metal wires. After the wires in the pipe have been compacted into a "rod", slices are cut from the rod. Some means is required to hold adjacent ends of the wires together; however, such means should not make the remaining portions of the strands of wire stick to one another. Therefore, the strain buffer 20 may be provided with a metallic foil 20a, shown partially broken away in FIG. 2, and which is thermo-compression diffusion bonded to the upper, adjacent ends of the wire strands of the strain buffer 20 (as viewed in FIG. 2). Alternative means of holding together adjacent ends of the wire strands of the strain buffer 20 are illustrated in FIGS. 3A and 3B. These FIGS. shown enlarged, fragmentary portions of a structured metal, strain buffer, held together respectively by solder 20b (partially broken away) and by mechanical compaction of adjacent ends of the wire strands. Advantageously, the wire strands of the strain buffer 20 are formed from copper wire, or aluminum wire for lower weight. Further details of construction of a strain buffer 20 are provided in J. W. Butler and H. H. Glascock, "Dual SCR Power Module", Proceedings of the IEEE 1980 National Aerospace and Electronics Conference, NAECON 1980 (Dayton, Ohio, May 20–22,1980), pages 598–604 (Volume 2), incorporated herein by reference. Further details of the technique of thermo-compression diffusion bonding are provided in U.S. Pat. Nos. 4,204,628—D. E. Houston and J. A. Loughran and 4,252,263—D. E. Houston, also incorporated herein by reference.

The strain buffer 20 serves the purpose of materially reducing strain between the insulating medium 19 and the lower housing surface 16. This strain is caused by the different rates of thermal expansion of the insulating medium 19 (or the anode strap 17 if the insulating medium 19 is deleted) and the housing surface 16, the housing 14 being comprised of aluminum in the specific, embodiment herein described.(This embodiment is particularly low in weight whereby, for example, it is especially suited for use in an airborne cycloconverter.) With the lower surface of the insulating medium 19 and the surface 16 bonded respectively to the upper and lower surfaces of the strain buffer 20, the lower ends of the wire strands of the strain buffer 20 are "indexed" to the surface 16, and the upper ends of the wire strands of the strain buffer 20 are indexed to the lower surface of the insulating medium 19. With the wire strands of the strain buffer 20 so indexed, high thermal conductivity is maintained between the lower surface of the insulating medium 19 and the surface 16, and, at the same time, the opposite ends of the wire strands are able to move according to the different thermal expansion rates of the respective materials to which they are bonded. In this manner, strain between the insulating medium 19 and the surface 16 is greatly alleviated.

A structured metal strain buffer 29 provides a connection having both high electrical and thermal conductivities between the upper surface of the thyristor semiconductor portion 10a and the lower surface of a cathode strap 23, suitably formed of solid copper. The strain buffer 29 is suitably constructed in the same manner as the strain buffer 20. As is the case with the upper surface of the strain buffer 20, the lower surface of the strain buffer 29 is provided with means (not shown) to hold the wire strands thereof together. The parts 23, 29 and 10a are respectively bonded together with solder layers 25 and 27 (shown in FIG. 2). The strain buffer 29 materially alleviates strain between the cathode strap 23 and the thyristor semiconductor portion 10a. The strain buffer 29 additionally is especially useful for drawing heat away from the thyristor 10 during a "surge" condition. A surge condition occurs when a half-cycle overload current passes through the thyristor 10 and generates an extraordinary amount of heat.

The use of the strain buffers 20 and 29 enables the present thyristor packaging system to undergo temperature excursions to low temperatures not heretofore attainable. This is due to the ability of the strain buffers 20 and 29 to accomodate widely different thermal expansions of the materials to which they are bonded.

The cathode strap 23 is connected to circuitry external of the housing 14 via a ceramic-insulated feedthrough 26 of conventional structure. The gate electrode of the thyristor 10 (the center circle on the upper surface of the thyristor 10 as shown in FIG. 2) is connected to circuitry external of the housing 14 via a foil strap 27 and a glass-insulated feedthrough 28 of conventional construction. In order to avoid electrical breakdown between the feedthroughs 26 and 28 and connections made thereto, an epoxy potting compound 30, shown partially broken away and partially in cross section, is provided at the end of the housing 14 where the feedthroughs 26 and 28 are located.

The thyristor packaging system for the thyristor 12, apart from the specific configuration of the anode and cathode straps 31 and 32 used, suitably comprises a packaging system identical to that for the thyristor 10. The provision of the two thyristors 10 and 12, with the electrical interconnections as shown, provides for versatility in connecting into an electrical circuit.

A typical procedure for assembling the thyristor packaging system described above is presented as follows with respect only to the thyristor 10, the procedure with respect to the thyristor 12 being directly analagous. The aluminum housing 14 is prepared for soldering by being plated with tin using the known, zincating process. All the feedthroughs shown are then soldered in place with, for example, Indalloy ® No. 151 solder, a high lead (i.e. 92.5% Pb) solder. If necessary, the electrodes of the thyristors 10 and 12 are prepared for soldering such as by sputter cleaning and sputter coating with a metal layer or layers which provide a good bonding surface for solder. The solder layers 18, 21, 22, 24, 25 and 27 are suitably comprised of Indalloy ® No. 151 solder and are advantageously preformed into the configurations shown in FIG. 2. These solder layers, except for the layer 24, are next fused in one operation to provide a subassembly including the thyristor 10, which is not yet attached to the housing surface 16 and which can be readily inspected. Thereafter, the subassembly is soldered to the housing surface 16 with the solder layer 24, and, in the same operation, the conducting straps 23, 31 and 32 are connected to the large feedthroughs shown, suitably with Indalloy No. 151 solder. Also in this operation, the gate strap 27 is soldered to the feedthrough 28 suitably with Indalloy No. 151 solder (and the thyristor 12 gate strap is soldered to its respective feedthrough with the same composition solder). The thus completed assembly is then defluxed with a suitable defluxing fluid such as Formon ® defluxing fluid, sold by E. I. DuPont de Nemours & Co., and an insulative coating such as General Electric ® RTV 615, two-component silicone rubber is applied to the assembled parts within the housing 14, taking care to remove trapped air from the insulative coating. The housing cover 15 is next sealed to the body of the housing 14, suitably with 63% Sn-37% Pb solder. The 63% Sn-37% Pb solder has a lower fusing temperature than does the 92.5% Pb solder used for the solder layers 18, 21, 22, 24, 25 and 27. This prevents the foregoing layers of solder from being refused when the cover 15 and the feedthroughs are being soldered in place. Advantageously, the housing 15 is filled with an inert atmosphere such as nitrogen before soldering the cover 15 in place to help prevent electrical discharges between the various electrical conductors within the housing 14.

The thyristors 10 and 12 typically are provided with passivation layers. Such a layer must be able to withstand the temperatures involved in the foregoing operations which typically reach 280° C. with the Indalloy ® No. 151 solder.

For a thyristor 10 or 12 having a diameter of 18 mm, the following dimensions for the following parts have been found to be suitable:

| | |
|---|---|
| Cathode strap 23 | 15 mils thick |
| Structured metal, strain buffer 29 | 100 mils thick (with individual wire strands having a diameter of 10 mils) |
| Anode strap 17 | 15 mils thick |
| Insulating medium 19 | 45 mils thick (with 5 mils thickness for layers of metal foil 19a and 19c) |
| Structured metal strain buffer 20 | 100 mils thick (with individual wire strands having a diameter of 10 mils). |

The embodiment of the present invention described herein provides a low weight, hermetic, dual thyristor package which is especially suited for use with an airborne cycloconverter. While the invention has been described with respect to this embodiment, modifications thereof will occur to those skilled in the art. For example, the housing 14 can be formed from metals other than aluminum, such as copper having the proper surface preparation for soldering, although a heavier thyristor packaging system would result. Further, methods of bonding together the various parts of the invention other than soldering as described herein can be used. For example, the bonds provided by the solder layers 18, 21, 22, 24, 25 and 27 could be replaced with bonds provided through the technique of thermo-compression diffusion bonding, as referenced above. Additionally, as discussed above, a bond between the thyristor anode portion 10b and the anode strap 17 would suitably include a structured metal, strain buffer if the thyristor 10 has a sufficiently large diameter, such as 2 inches. The foregoing and other such modifications are intended to fall within the true spirit and scope of the appended claims.

What we claim as our invention and desire to have secured by Letters Patent of the United States is:

1. A thyristor packaging system comprising:
  (a) an aluminum support having a thickness of less than about 50 mils and having an upper surface;
  (b) a first structured metal, strain buffer comprised of a bundle of substantially parallel, closely packed strands of metal wire, said strain buffer having upper and lower surfaces respectively formed from upper, adjacent ends of said strands of metal wire and from lower, adjacent ends of said strands of metal wire, said strain buffer lower surface having a bond with said aluminum support upper surface;
  (c) a first conductive strap having upper and lower surfaces;
  (d) low thermal impedance and electrically insulating means connecting said first strap lower surface to said strain buffer upper surface;
  (e) a thyristor having upper and lower surfaces each with an electrode thereon, said thyristor lower electrode having a bond with said first strap upper surface; and
  (f) a second conductive strap having a lower surface, said strap lower surface having a bond with said thyristor upper electrode.

2. The system of claim 1 wherein said bond between said thyristor upper electrode and said second strap lower surface comprises a second, structured, metal strain buffer having a bundle of substantially parallel, closely packed strands of metal wire, said second strain buffer having upper and lower surfaces respectively formed from upper, adjacent ends of said strands and from lower, adjacent ends of said strands.

3. The system of claim 1 wherein said low thermal impedance and electrically insulating means comprises a ceramic insulator having upper and lower surfaces.

4. The system of claim 3 wherein said ceramic insulator comprises one of the group consisting of beryllium oxide and alumina.

5. The system of claim 4 further comprising first and second layers of metal foil direct bonded, respectively, to said ceramic insulator upper and lower surfaces.

6. The system of claim 1 wherein said thyristor comprises a pellet-shaped thyristor having a diameter larger than about 12 millimeters.

7. The system of claim 6 wherein said thyristor has a diameter larger than about 18 millimeters.

8. The system of claim 6 wherein said first strap comprises substantially solid metal.

9. The system of claim 8 wherein said solid metal comprises copper.

10. The system of claim 1 wherein said low thermal impedance means bonds said first strap lower surface to said strain buffer upper surface.

11. The system of claim 1 wherein each of said bonds comprises a solder bond.

12. The system of claim 1 wherein each of said bonds comprises a thermo-compression diffusion bond.

13. The system of claim 1 wherein said aluminum support comprises a lower, interior surface of an enclosed housing, said housing having a lowermost surface which is opposed to said aluminum support upper surface and through which heat from said thyristor is withdrawn.

14. The system of claim 13 wherein said housing is hermetic.

15. The system of claim 2 wherein each of said first structured metal, strain buffer and said second, structured metal, strain buffer comprises metal wire strands of a material selected from the group consisting of copper and aluminum.

16. The system of claim 2 wherein said adjacent wire strands of both said first structure metal, strain buffer and said second, structured metal, strain buffer comprise copper.

17. The system of claim 2 wherein said adjacent wire strand ends of said upper surface of said first structured metal, strain buffer and said adjacent wire strand ends of said lower surface of said second, structured metal strain buffer are respectively held together by means comprising solder.

18. The system of claim 2 wherein said adjacent wire strand ends of said upper surface of said first structured metal, strain buffer and said adjacent wire strands ends of said lower surface of said second, structured metal strain buffer are respectively held together by means comprising direct bonded metal foil.

19. The system of claim 2 wherein said adjacent wire strand ends of said upper surface of said first structured metal, strain buffer and said adjacent wire strand ends of said lower surface of said second, structured metal strain buffer are respectively held together by mechanical compaction thereof.

* * * * *